United States Patent
Heintz et al.

(10) Patent No.: US 10,144,638 B2
(45) Date of Patent: Dec. 4, 2018

(54) METHODS OF DISPERSING CARBON NANOTUBES

(75) Inventors: Amy M. Heintz, Delaware, OH (US); Jeffrey Cafmeyer, Columbus, OH (US); Joel D. Elhard, Hilliard, OH (US); Bhima R. Vijayendran, Kuala Lumpur (MY)

(73) Assignee: Battelle Memorial Institute, Columbus, OH (US)

( * ) Notice: Subject to any disclaimer, the term of this patent is extended or adjusted under 35 U.S.C. 154(b) by 2087 days.

(21) Appl. No.: 12/282,304

(22) PCT Filed: Mar. 9, 2007

(86) PCT No.: PCT/US2007/006081
§ 371 (c)(1),
(2), (4) Date: Feb. 1, 2009

(87) PCT Pub. No.: WO2008/054472
PCT Pub. Date: May 8, 2008

(65) Prior Publication Data
US 2009/0317660 A1      Dec. 24, 2009

Related U.S. Application Data

(60) Provisional application No. 60/780,631, filed on Mar. 9, 2006, provisional application No. 60/872,824, filed on Dec. 24, 2006.

(51) Int. Cl.
*B32B 9/00* (2006.01)
*B82Y 10/00* (2011.01)
(Continued)

(52) U.S. Cl.
CPC ............... *B82Y 10/00* (2013.01); *B82Y 30/00* (2013.01); *B82Y 40/00* (2013.01); *C01B 32/174* (2017.08);
(Continued)

(58) Field of Classification Search
CPC .......................... C01B 31/022; C01B 2202/00
(Continued)

(56) References Cited

U.S. PATENT DOCUMENTS

2002/0161101 A1* 10/2002 Carroll et al. ................. 524/495
2003/0122111 A1*  7/2003 Glatkowski ................... 252/500
(Continued)

OTHER PUBLICATIONS

Valentini et al: "Selective interaction of single walled carbon nanotubes with conducting dendrimer" Diamond and Related Materials. vol. 15, No. 1, Jan. 2006, pp. 95-99.
(Continued)

*Primary Examiner* — Daniel H Miller
(74) *Attorney, Agent, or Firm* — Frank Rosenberg; C. Michael Gegenheimer

(57) ABSTRACT

A method is described for preparing carbon nanotube dispersions in organic solvents such as chloroform and methyl ethyl ketone. Structures resulting from organic dispersions are also disclosed. The dispersing agents used in this method comprise long chain hydrocarbons, halogen-substituted hydrocarbons, fluorocarbons, or a mixture of hydrocarbons, halogen-substituted hydrocarbons, and fluorocarbons; wherein the hydrocarbons, halogen-substituted hydrocarbons and fluorocarbons have from 6 to 40 carbons in a chain, at least one alkene or alkyne moiety, and at least one pendant carboxylic acid, phosphonic acid, and/or sulfonic acid group or an ester of these acids.

24 Claims, 1 Drawing Sheet

(51) Int. Cl.
  *B82Y 30/00* (2011.01)
  *B82Y 40/00* (2011.01)
  *H01L 51/00* (2006.01)
  *C01B 32/174* (2017.01)

(52) U.S. Cl.
  CPC ...... *H01L 51/0007* (2013.01); *C01B 2202/02* (2013.01); *C01B 2202/06* (2013.01); *C01B 2202/28* (2013.01); *H01L 51/0048* (2013.01)

(58) Field of Classification Search
  USPC .................... 428/408; 423/447.1, 447.2, 448
  See application file for complete search history.

(56) References Cited

U.S. PATENT DOCUMENTS

| | | |
|---|---|---|
| 2004/0120879 A1* | 6/2004 | Chen et al. ................ 423/447.1 |
| 2006/0045838 A1 | 3/2006 | Patrick et al. |
| 2006/0121185 A1* | 6/2006 | Xu et al. .................... 427/163.1 |
| 2007/0265379 A1* | 11/2007 | Chen et al. .................. 524/404 |
| 2008/0063586 A1 | 3/2008 | Oya et al. |
| 2008/0286559 A1 | 11/2008 | Lee et al. |
| 2009/0200517 A1 | 8/2009 | Bounia et al. |

OTHER PUBLICATIONS

Holzinger et al: "Functionalization of single-walled carbon nanotubes with (R-)oxycarbonyl nitrenes" J. Am. Chem. Soc.; Journal of the American Chemical Society, Jul. 16, 2003, vol. 125, No. 28. pp. 8566-8580.
International Search Report; WO 2008/054472 A3, dated Apr. 22, 2008.

* cited by examiner

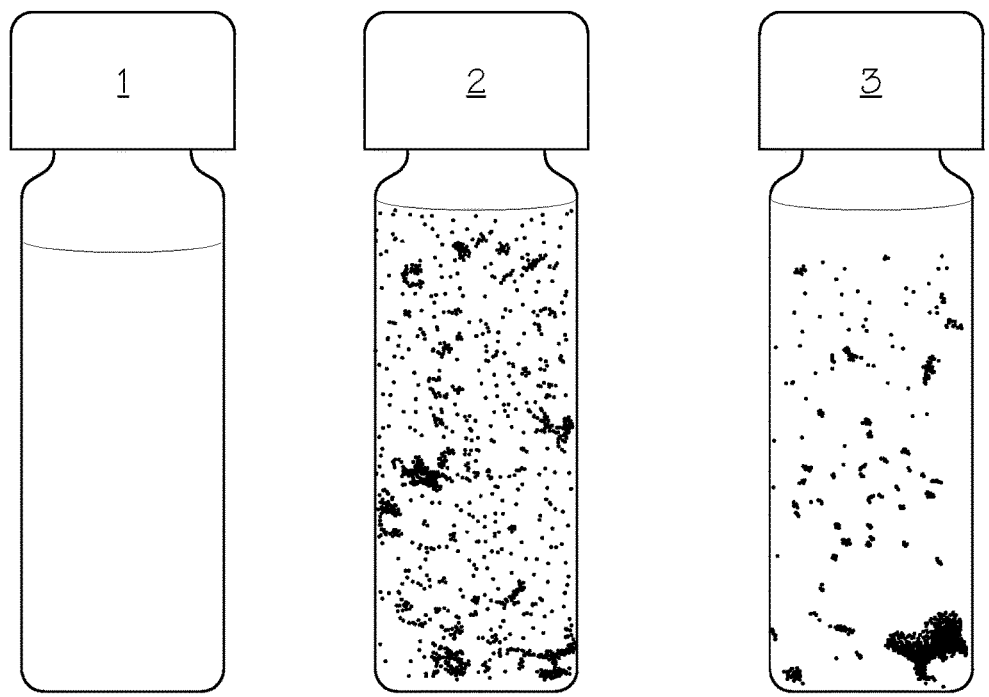

METHODS OF DISPERSING CARBON NANOTUBES

RELATED APPLICATIONS

This application is a national stage filing and claims the priority benefit of PCT/US07/06081 filed Mar. 9, 2007 and also claims the priority benefit of U.S. Provisional Patent Application No. 60/780,631, filed Mar. 9, 2006 and U.S. Provisional Patent Application No. 60/871,824,filed Dec. 24, 2006.

STATEMENT OF GOVERNMENT RIGHTS

This invention was made under a CRADA No. NFE-06-00133 between Battelle Memorial Institute and UT-Battelle, LLC management and operating Contractor of the Oak Ridge National Laboratory for the United States Department of Energy. The Government has certain rights in this invention.

BACKGROUND

Carbon nanotubes are a class of nanomaterials that have the potential to provide a variety of new, and previously unattainable, combinations of properties to materials. One emerging area is solution-processed, flexible, conductive coatings. Carbon nanotubes can be dispersed in a medium, and processed by conventional solution processing methods to give flexible, conductive layers, and, if desired, transparent, flexible conductive layers. Another area is conductive polymer composites. Carbon nanotubes can be dispersed in a polymer matrix to give a conductive polymer composite that retains the mechanical and processing properties of the polymer.

A key issue for most applications employing carbon nanotubes is dispersion. The carbon nanotubes must be dispersed in a medium that is compatible with the process and/or with the polymers. Owing to their high surface area and small diameters, carbon nanotubes are very difficult to disperse and many of the typical methods used for dispersing conventional pigments are not effective.

The ideal dispersion method would employ a combination of dispersing agents and solvents that are amenable to a variety of processes. For example, spraying requires the use of volatile solvents, coating on polymer substrates requires the use of solvents that do not etch the substrate, and blending with polymers requires systems that are compatible with the monomer or polymer. The dispersing agents and solvents should have minimal environmental impact and health risks. Finally, the method should not negatively affect the performance properties, such as the conductivity, of the nanotubes. Ideally, the dispersant should be "fugitive" once it has performed its intended role of dispersing CNTs and thus aid in realizing the desired electrical and other properties of CNTs.

The most common method described in the open literature is the use of aqueous surfactant solutions, such as sodium dodecylbenzene sulfonate, sodium lauryl sulfate, and Triton X-100. High quality dispersions can be prepared by suspending the carbon nanotubes in the surfactant solution at dilute concentration, sonicating, and centrifuging. Such aqueous dispersions are suitable for only a limited number of applications. Most polymers and their monomers are not soluble in water; therefore, aqueous dispersions are not suitable for many multifunctional coatings and nanocomposite applications. In these dispersions, the weight ratio of surfactant to nanotube is quite high. Therefore, these dispersions are not appropriate for preparing conductive coatings by most solution processing methods unless the surfactant is removed during or after film formation.

Another common method described in the literature is the use of dichlorobenzene. Carbon nanotubes can be dispersed in dichlorobenzene after ultrasonication. Dichlorobenzene overcomes some of the problems of aqueous solutions, since it is compatible with more organic monomers and polymers and leaves little additional residue upon drying. However, it is high boiling, hazardous for health and environment, and etches many polymer substrates.

Finally, non-polar, aprotic solvents such as N-methylpyrollidione (NMP), dimethylformamide (DMF), and dimethylacetamide (DMAC) are often used. Similarly, aliphatic amines have been used to disperse SWNTs in solvents such as THF. Unfortunately, these systems tend to decrease the conductivity, particularly if no high temperature drying step is used to remove them, as in the case of polymer composite formation.

SUMMARY OF THE INVENTION

In a first aspect, the invention provides a process for dispersing carbon nanotubes in an organic solvent, comprising: mixing carbon nanotubes with a dispersing agent; wherein the dispersing agent comprises long chain hydrocarbons, halogen-substituted hydrocarbons, fluorocarbons, or a mixture of hydrocarbons, halogen-substituted hydrocarbons, and fluorocarbons; and wherein the hydrocarbons, halogen-substituted hydrocarbons and fluorocarbons have from 6 to 40 carbons in a chain, at least one alkene or alkyne moiety, and at least one pendant carboxylic acid, phosphonic acid, and/or sulfonic acid group or an ester of these acids. The term "hydrocarbons" includes aliphatic and aromatic hydrocarbons. Preferred dispersing agents are described below. The treatment is preferably carried out in conjunction with process steps such as sonication; these are also discussed in greater detail below.

The invention also includes carbon nanotube dispersions, carbon nanotube networks, and carbon nanotube/polymer composites made by the processes of the invention.

In another aspect, the invention provides a structure comprising a carbon nanotube film deposited from organic solvent. This carbon nanotube film exhibits: a transmittance of about 80% at 550 nm and a sheet resistance of 20 to about 100,000 ohms/square; or a bulk conductivity in the range 1 to 1000 S/cm. Preferably, the film exhibits both of these properties. The invention also includes a method of making this structure. The fact that the film is deposited from an organic solvent is an important feature of the invention since it can result in structures that cannot be obtained from aqueous dispersions; for example, a film directly deposited on a hydrophobic or water soluble/swellable substrate. Generally, microscopic examination or chemical analysis of a structure can determine whether it has been deposited from an organic solvent or from water.

In the present invention, an "organic solvent" is any solvent containing a carbon atom. The dispersing agents are one type of solvent. Volatile organic solvents are preferred for this invention, where the term volatile in taken as any solvent exhibiting a boiling point less than 110° C. and/or a vapor pressure greater than 6 torr at 20° C. Solvents preferred in this invention include, but are not limited to, methyl ethyl ketone, acetone, propyl acetate, butyl acetate, ethyl acetate, ethanol, methanol, propanol, tetrahydrofuran, diethyl ether, dioxane, chloroform, methyl t-butyl ether, dichloroethane, and methylene chloride.

This invention describes a class of dispersing agents and a process for dispersing carbon nanotubes in various organic solvents that, in various embodiments, can possess one or more of the following advantages: (1) uses minimal dispersing agent; (2) uses non-toxic dispersing agents; (3) is appropriate for a range of solvents such as chloroform and methyl ethyl ketone; (4) does not lower the conductivity of the resulting film.

BRIEF DESCRIPTION OF THE DRAWING

The FIGURE illustrates flocculation for examples 1-3 in a visual dispersion test.

DETAILED DESCRIPTION OF THE INVENTION

The term "carbon nanotubes" or "CNTs" includes single, double and multiwall carbon nanotubes and, unless further specified, also includes bundles and other morphologies. The invention is not limited to specific types of CNTs. Suitable carbon nanotubes include single-wall carbon nanotubes prepared by HiPco, Arc Discharge, CVD, and laser ablation processes; double-wall carbon nanotubes (DWNTs), single double triple wall carbon nanotubes, few walled, and multi-wall carbon nanotubes, as well as covalently modified versions of these materials. The CNTs can be any combination of these materials, for example, a CNT composition may include a mixture of single and multi-walled CNTs, or it may consist essentially of DWNT and/or MWNT, or it may consist essentially of SWNT, etc.

The dispersing method described in this invention relies on the interaction of carbon nanotubes with certain polarizable molecules, such as ester and carboxylic acid carbonyls combined with unsaturated alkyl groups such as alkenes and alkynes. The strong interaction between carbon nanotubes and these dispersing agents provides steric stabilization in organic solvents such as chloroform, tetrahydrofuran, methyl ethyl ketone, butyl acetate, etc.

Suitable dispersing agents are described in the Summary section. Among other limitations, dispersing agents of the present invention may include unsaturated straight-chain and branched aliphatic carboxylic acids and esters, where the preferred unsaturated units are one or more alkene or alkyne units, most preferably alkynes. The concentration of the CNTs in a dispersion are preferably between 0.01 wt % to 1.0 wt % (CNTs as a wt % of the entire dispersion). The dispersion can be made in pure dispersing agent or dispersing agent in an organic solvent. In some preferred embodiments, CNTs are dispersed in a pure dispersing agent or a mixture of dispersing agents (preferably without organic solvent).

In some preferred embodiments, the hydrocarbons and/or fluorocarbons in the dispersing agents have from 8 to 24 (more preferably 8 to 22) carbons in a chain. In some preferred embodiments, the dispersing agent comprises a sulfonic acid, sulfonic ester, phosphonic acid, or phosphonic ester group. In some preferred embodiments, the dispersing agents do not contain any halogens other than F. Some specific dispersing agents include: ethyl-2-octynoate, methyl oleate, oleic acid, or methyl-5-hexyonate. In some embodiments, the dispersing agent includes a sulfonyl head and a oligourethane or oligo-siloxane tail. In some embodiments, the dispersing agent includes a dendrimer.

In some preferred embodiments, the dispersing agent comprises: a long straight chain or branched carboxylic acid or ester with the structure:

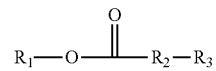

where $R_1$ is H or straight chain or branched aliphatic, $R_2$ is a group containing one or more non-conjugated alkenes or alkynes or their mixtures, and $R_3$ is straight chain or branched aliphatic.

In some preferred embodiments, the dispersing agent comprises: a long straight chain or branched carboxylic acid or ester containing at least one or more non-conjugated alkenes or alkynes and at least 6 carbon atoms with a structure such as:

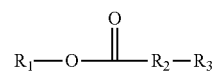

where $R_1$ is H or straight chain or branched aliphatic, $R_2$ is a straight chain or branched alkyl group, and R3 is a group containing one or more non-conjugated alkenes or alkynes or their mixtures.

In some preferred embodiments, the dispersing agent comprises:

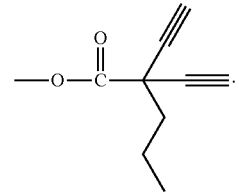

The invention includes all permutations of dispersing agent structures that are within the limitations set forth for the inventive method described in the Summary section. The dispersing agent should not include amines or alcohols since these groups can lower conductivity of CNTs.

Carbon nanotubes can be treated with dispersing agent and sonication. Sonication energy can be applied using any appropriate technique; for example, bath, tip horn, or cup horn, microplate horn, or flocell sonicators operating with frequency in the range of 20 to 75 kHz, preferably 20 to 40 kHz, and power up to about 1000 watts. The actual amount of energy delivered to the sample depends on the temperature, amount and type dissolved gases, sample geometry, probe geometry, position in bath, and viscosity of the fluid. An advantage of this invention is that dispersing agents that are liquid, and thus have low viscosity, and facilitate cavitation and delivery of ultrasonic energy to the sample.

Optionally, the CNT dispersion (which is typically in the form of a paste) can be passed through a filter or centrifuged to remove excess dispersing agent. In some cases, excess dispersing agent is further removed by washing with a solvent having limited compatibility with the dispersing agent. Good washing solvents include, but are not limited to, methyl ethyl ketone, diethyl ether, chloroform, ethyl acetate. In other cases, when excess dispersing agent can be tolerated, it may be desirable to retain excess dispersing agent to increase the maximum dispersible fraction. The preferred amount of excess dispersing agent is related to the surface area of the CNT. For SWNTs, the ratio of CNT/dispersing agent (w/w) may be in the range of 1:20 mg up to 1:1000, more preferably at least 1:60.

The treated CNTs, and optionally additional dispersing agent, can be dispersed in organic solvents such as chloroform, tetrahydrofuran, dioxane, ethyl acetate, butyl acetate, propyl acetate, xylenes, cresols, methyl ethyl ketone, and combinations of these. Wetting agents such as 2-ethyl-1-hexanol may be added to improve the compatibility of the formulation. The mixture can be dispersed by sonication. The dispersions exhibit a lower critical solution temperature. Upon exceeding certain critical temperatures (which vary according to solvent, in some cases about 75° C.), the dispersion flocculates. Therefore, temperatures above the flocculation temperature must be avoided. Preferably, the process results yields a dispersion of carbon nanotubes in organic solvent of at least 8 mg CNT per liter dispersion; in some embodiments 8 to 500 mg/L, and in some embodiments 8 to 200 mg/L. Preferably, the organic solvent is volatile; the volatile organic solvent may then be evaporated off.

The organic dispersion can be handled similar to other organic compositions. It may, for example be deposited onto a surface. Any deposition technique known for use with organic solutions can be used. Spin coating is one example. The technique is especially useful for coating hydrophobic surfaces; it is also useful for coating polymers—especially hydrophobic polymers. Water soluble/swellable is used to mean surfaces that react, dissolve, or swell upon exposure to water. Hydrophobic is used to mean surfaces that have high contact angle with water (e.g. greater than 90°), which would be difficult to coat with aqueous solvents due to the difficulty in wetting such substrates with water. Because of the large property differences between water and organic solvents, the skilled engineer can distinguish coatings prepared from aqueous dispersions as compared to coating prepared from organic dispersions.

Carbon nanotube network structures can be obtained by removing the organic solvent, typically by evaporation. The carbon nanotubes that result from the treatment preferably exhibit a G/D ratio in the Raman spectrum of at least 14 and an onset of decomposition determined by thermogravimetric analysis in air of at least 380° C. Preferably, the dispersing agent does not lower the conductivity of the final product (the conductivity of the product is no less than the conductivity of the starting material.

This invention also includes a CNT structure that can be a CNT film, by itself, or a larger structure that includes a film. In some preferred embodiments, the carbon nanotube film is disposed on a polymeric and/or hydrophilic surface. In some preferred embodiments, the carbon nanotube film exhibits a transmittance of about 80% at 550 nm and a sheet resistance of 20 to about 20,000 ohms/square. In some preferred embodiments, the carbon nanotube film exhibits a bulk conductivity of 1 to 200. S/cm.

EXAMPLES

Dispersion Process

Example 1

Single wall carbon nanotubes (HiPco, CNI Purified Grade) were blended with oleic acid (0.3 wt %) and sonicated with a tiphom for 0.5 h to 4 hours. The resulting paste was passed through a nylon membrane to remove excess oleic acid and washed with a small amount of methylene chloride. The treated nanotube were suspended in chloroform at a concentration of 0.01 mg/mL and sonicated with a tiphom for 2 minutes.

Example 2

Single wall carbon nanotubes (HiPco, CNI Purified Grade) were blended with oleic acid (0.3 wt %) and tumbled in a jar with glass beads for 3 days. The resulting paste was passed through a nylon membrane to remove excess oleic acid and washed with a small amount of methylene chloride. The treated nanotubes were suspended in chloroform at a concentration of 0.01 mg/mL and sonicated with a tiphom for 2 minutes.

Example 3

Single wall carbon nanotubes (HiPco, CNI Purified Grade) were suspended in a chloroform solution containing 0.005% oleic acid at a concentration of 0.003 mg/mL. The solution was sonicated with a tiphom for 2 minutes.

The dispersions were first assessed visually by passing light through and observing the clarity. Only Example 1 passed the visual dispersion test. Examples 2 and 3 both began flocculating as soon as sonication commenced. The results show that a pre-treatment step with sonication yields good dispersion and requires only a minimal amount of dispersing agent.

Dispersion by way of the methods described in Example 1 was carried out by replacing chloroform with other solvents. The oleic acid (OA) treated SWNTs are readily dispersed in tetrahydrofuran, chloroform and methyl ethyl ketone. They cannot be dispersed in hexane or toluene. They have limited dispersability in xylenes. If the treated nanotubes are washed with copious amounts of methylene chloride, they cannot be dispersed in chloroform, suggesting that the dispersing agent is removed, and therefore, interacts via a non-covalent interaction.

The maximum dispersible concentration was determined by sequential addition of the treated carbon nanotubes to solvent and sonication with a tiphom for 2 minutes, until a small amount of precipitate was observed on standing. Dispersions were centrifuged at 3000 rpm and then analyzed by UV-Vis Spectroscopy. The dispersed concentration was determined from a calibration curve for the specific SWNT.

Using the method described in Example 1 for chloroform, tetrahydrofuran, and methyl ethyl ketone, the maximum dispersed concentration was determined. The results are shown in the Table below.

TABLE 1

Maximum dispersible fraction achieved in organic solvents

| Dispersing Agent | Solvent | Method | SWNT Dispersability (mg/L) |
|---|---|---|---|
| Oleic acid | Methyl ethyl ketone | Example 1 | 2 |
| Methyl oleate | Methyl ethyl ketone | Example 5 | 8 |
| Oleic acid | Chloroform | Example 1 | 10 |
| Oleic acid | tetrahydrofuran | Example 1 | 50 |

The method described in Example 1 is carried out in a way that uses the minimal amount of dispersing agent in the final dispersion. Calculations based on mass gain of the SWNTs before and after treatment indicate that the amount of oleic acid remaining on the SWNTs after treatment is approximately 2 to 10 times the mass of the SWNTs.

Example 4

Single wall carbon nanotubes (HiPco, CNI Purified Grade) were blended with methyl oleate (0.04 wt %) and sonicated with a tiphom for 30 minutes. The mixture was incubated at 150° C. for 1 h and then passed through a nylon membrane filter. The amount of residual methyl oleate remaining was determined by mass balance. Multiple samples were prepared to study the influence of methyl oleate to SWNT ratio. Additional methyl oleate was added to samples, as needed, to prepare samples with methyl oleate to SWNT ratios (w/w) from 1/1 to 500/1. Methyl ethyl ketone was added to the mixtures and sonicated for 15 minutes. Subsequent additions of methyl ethyl ketone were added, 2-10 mL at a time, until the sample appeared dispersed by visual inspection.

Example 5

Single wall carbon nanotubes (HiPco, CNI Purified Grade) were blended with methyl oleate (0.04 wt %) and sonicated with a tiphom for 4 minutes. The mixture was passed through a nylon membrane filter. The resulting paste was determined to be 2.91 w % SWNT and 97.09 wt % methyl oleate. Methyl ethyl ketone and additional methyl oleate were added to the paste to give a final formulation of 1.5 mg SWNT, 115 mg methyl oleate, and 20 mL of methyl ethyl ketone. The mixture was sonicated with a tiphom for 0.5 h, centrifuged at 3000 rpm, and the supernatant analyzed by UV-Vis spectroscopy.

If larger amounts of dispersing agent can be tolerated in the process, the addition of more dispersing agent can increase the maximum dispersible fraction. The influence of increasing the ratio of methyl oleate to SWNT in the final dispersion is shown in Table 2. As shown in the Table, increasing the ratio of methyl oleate to SWNT can increase the dispersible fraction by up to 4 times; however, the addition of too much methyl oleate causes the dispersible fraction to go down. It should be noted that the stability of these dispersions at this concentrations is limited to several hours.

TABLE 2

Influence of methyl oleate/SWNT ratio on dispersion of SWNTs in methyl ethyl ketone (MEK)

| Methyl Oleate/SWNT (w/w) | Concentration SWNT in MEK (mg/L) |
| --- | --- |
| 1.3 | 40 |
| 26 | 50 |
| 62 | 130 |
| 93 | 140 |
| 105 | 180 |
| 416 | 50 |

The maximum dispersible fraction was determined as in Example 5, by centrifuging the sample and analyzing the supernatant by UV-Vis spectroscopy. As shown in Table 1, by including a higher concentration of methyl oleate in the dispersion, the maximum dispersible fraction was 8 mg/L in methyl ethyl ketone.

Dispersion of Different Types of Nanotubes

Single-walled nanotubes (HiPco from CNI Purified grade) and double-walled nanotubes (CVD from Helix) were treated with oleic acid as described in Example 1. Both types of nanotubes gave optically clear dispersions in chloroform.

Comparison of Dispersing Agents

Example 6

Single wall carbon nanotubes (HiPco, CNI Purified Grade) were blended with a dispersing agent (0.02 wt %) and sonicated with a tiphorn for 1 h. The resulting mixture was passed through a nylon membrane and washed with 10 mL of methyl ethyl ketone. The treated SWNTs were added to 200 mL of methyl ethyl ketone, sonicated for 30 minutes, and allowed to stand overnight and then centrifuged at 3000 rpm. The resulting supernatant was analyzed by UV-Vis spectroscopy and the maximum dispersible concentration was determined based on the absorbance from 550-780 nm compared to a calibration curve.

Several dispersing agents were investigating, using the method described in Example 6, which uses minimal dispersing agent in the final dispersion. Methyl ethyl ketone was chosen as a test solvent since it is a common coating solvent and also presents a major challenge for dispersing SWNTs. Even low concentrations (<<0.1 ppm) of SWNTs cannot be dispersed in methyl ethyl ketone. The results for different dispersing agents are shown in Table 3.

TABLE 3

Effectiveness of different dispersing agents for SWNTs in methyl ethyl ketone

| Dispersing Agent | Structure | SWNT Dispensability in MEK (mg/L) |
| --- | --- | --- |
| Ethyl-2-octynoate | (structure shown) | 1.3 |
| Methyl Oleate | (structure shown) | 1.0 |

TABLE 3-continued

Effectiveness of different dispersing agents for SWNTs in methyl ethyl ketone

| Dispersing Agent | Structure | SWNT Dispensability in MEK (mg/L) |
|---|---|---|
| 9-Decenoic acid | HOOC-(CH₂)₇-CH=CH₂ | 0.8 |
| Methyl 9-decenoate | CH₃O-CO-(CH₂)₇-CH=CH₂ | 0.5 |
| Methyl-5-hexynoate | CH₃O-CO-(CH₂)₃-C≡CH | 0.4 |
| Methyl-10-undecynoate | CH₃O-CO-(CH₂)₈-C≡CH | 0.4 |
| Linolenic acid | HOOC-(CH₂)₇-CH=CH-CH₂-CH=CH-CH₂-CH=CH-CH₂-CH₃ | 0.2 |
| Linoleic acid | HOOC-(CH₂)₇-CH=CH-CH₂-CH=CH-(CH₂)₄-CH₃ | 0.1 |
| Methyl laurate | CH₃O-CO-(CH₂)₁₀-CH₃ | 0.0 |

Unsaturated units in the alkyl chain improve dispersing agent effectiveness, where alkyne is better than alkene. The chain length is less important, though methylene chain lengths less than four do not provide good steric stabilization. Both carboxylic acids and esters are suitable for dispersing CNTs. Carboxylic esters are preferable for some applications due to their higher volatility.

Comparison of Electrical Properties with Benchmark System

Example 7

The dispersion described in Example 1 was passed through a mixed cellulose ester membrane. The resulting carbon nanotube mat was placed in contact with a polyester substrate, and transferred to the polyester substrate by applying heat and pressure

Example 8

Carbon nanotubes were suspended in an aqueous solution of SDBS in water at a concentration of 0.02 mg/mL. The suspension was sonicated with a tiphom for 30 minutes. The resulting carbon nanotube mat was washed with water and acetone, placed in contact with a polyester substrate, and transferred to the polyester substrate by applying heat and pressure.

Four-point probe measurements were used to characterize the sheet resistance of the carbon nanotube films. UV-Vis spectroscopy was used to characterize the optical transmittance at 550 nm, which is related to the volume fraction and thickness of the sample. As shown, at similar percent transmittance, and therefore similar thickness, the sheet resistance of OA-treated samples is much lower than that from SDBS. It is estimated that the bulk conductivity of the OA-treated samples is double that of what was achieved from the SDBS dispersions.

| Sample | % Transmittance (550 nm) | Sheet Resistance (Ω/square) |
|---|---|---|
| Example 7 | 66 | 470 |
| Example 8 | 57 | 925 |

We claim:

1. A process for dispersing carbon nanotubes in an organic solvent, comprising:
mixing carbon nanotubes with a dispersing agent; wherein the dispersing agent comprises long chain hydrocarbons, halogen-substituted hydrocarbons, fluorocarbons, or a mixture of hydrocarbons, halogen-substituted hydrocarbons, and fluorocarbons; and wherein the hydrocarbons, halogen-substituted hydrocarbons and fluorocarbons have from 6 to 40 carbons in a chain, at least one alkene or alkyne moiety, and at least one pendant carboxylic acid, phosphonic acid, and/or sulfonic acid group or an ester of these acids.

2. The process of claim 1 wherein the mixture of carbon nanotubes and dispersing agent is sonicated.

3. The process of claim 1 wherein excess dispersing agent is removed, and further wherein the carbon nanotubes resulting from this treatment are subsequently dispersed in a volatile organic solvent.

4. The process of claim 1 wherein the carbon nanotubes comprise multi-wall carbon nanotubes.

5. The process of claim 1 wherein a paste comprising carbon nanotubes and dispersing agent is obtained, and this paste is filtered to remove excess solvent and dispersing agent.

6. The process of claim 1 wherein, after treatment with the dispersing agent, the treated nanotubes are washed with a solvent to remove excess dispersing agent.

7. The process of claim 1 wherein the dispersing agent comprises hydrocarbons and/or fluorocarbons that have from 8 to 22 carbons in a chain.

8. The process of claim 1 wherein the dispersing agent comprises ethyl-2-octynoate, methyl oleate, oleic acid, or methyl-5-hexyonate.

9. The process of claim 1 wherein the dispersing agent comprises a sulfonyl head and a oligourethane or oligo-siloxane tail.

10. The process of claim 1 wherein the dispersing agent comprises a dendrimer.

11. The process of claim 1 wherein the process yields a dispersion of carbon nanotubes in organic solvent of at least 8 mg/L.

12. The process of claim 1 wherein the carbon nanotubes are dispersed in a volatile organic solvent selected from the group consisting of methyl ethyl ketone, butyl acetate, propyl acetate, and combinations thereof.

13. The process of claim 1 wherein the carbon nanotubes that result from the treatment exhibit a G/D ratio in the Raman spectrum of at least 14 and an onset of decomposition determined by thermogravimetric analysis in air of at least 380° C.

14. The process of claim 1 wherein the dispersing agent comprises a sulfonic acid, sulfonic ester, phosphonic acid, or phosphonic ester group.

15. The process of claim 1 wherein the dispersing agent does not lower the conductivity of the final product.

16. The process of claim 1 wherein the carbon nanotubes are first treated with neat dispersing agent and sonication, then washed to remove excess dispersing agent, and finally dispersed in organic solvent.

17. The process of claim 1 wherein the dispersing agent comprises:
a long straight chain or branched carboxylic acid or ester having the structure:

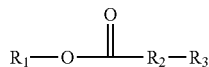

where $R_1$ is H or straight chain or branched aliphatic, $R_2$ is a group containing one or more non-conjugated alkenes or alkynes or their mixtures, and $R_3$ is straight chain or branched aliphatic.

18. The process of claim 1 wherein the dispersing agent comprises:
a long straight chain or branched carboxylic acid or ester containing at least one or more non-conjugated alkenes or alkynes and at least 6 carbon atoms with a structure such as:

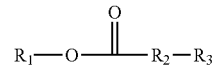

where $R_1$ is H or straight chain or branched aliphatic, $R_2$ is a straight chain or branched alkyl group, and R3 is a group containing one or more non-conjugated alkenes or alkynes or their mixtures.

19. The process of claim 1 wherein the dispersing agent comprises:

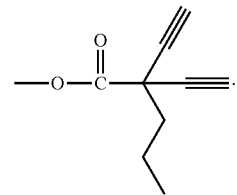

20. A carbon nanotube dispersion made by the process of claim 1.

21. A carbon nanotube network made by depositing the dispersion of claim 1 onto a hydrophobic polymeric substrate.

22. A carbon nanotube / polymer composite made from the dispersion of claim 1.

23. A structure comprising:
a carbon nanotube film deposited from organic solvent comprising the dispersing agent of claim 1 wherein the carbon nanotube film exhibits:
a transmittance of about 80% at 550 nm and a sheet resistance of 20 to about 100,000 ohms/square; or
a bulk conductivity in the range 1 to 1000 S/cm.

24. The structure of claim 23 comprising the dispersing agent of claim 1.

* * * * *